(12) United States Patent
Shrivastava et al.

(10) Patent No.: US 10,516,094 B2
(45) Date of Patent: Dec. 24, 2019

(54) PROCESS FOR CREATING DENSE PILLARS USING MULTIPLE EXPOSURES FOR MRAM FABRICATION

(71) Applicant: SPIN MEMORY, Inc., Fremont, CA (US)

(72) Inventors: Prachi Shrivastava, Fremont, CA (US); Mustafa Pinarbasi, Fremont, CA (US); Thomas Boone, Fremont, CA (US)

(73) Assignee: Spin Memory, Inc., Fremont, CA (US)

( * ) Notice: Subject to any disclaimer, the term of this patent is extended or adjusted under 35 U.S.C. 154(b) by 0 days.

(21) Appl. No.: 15/857,382

(22) Filed: Dec. 28, 2017

(65) Prior Publication Data

US 2019/0207082 A1   Jul. 4, 2019

(51) Int. Cl.
| | | |
|---|---|---|
| H01L 43/02 | (2006.01) | |
| H01L 21/3065 | (2006.01) | |
| H01L 43/12 | (2006.01) | |

(52) U.S. Cl.
CPC .......... *H01L 43/02* (2013.01); *H01L 21/3065* (2013.01); *H01L 43/12* (2013.01)

(58) Field of Classification Search
CPC ...... H01L 43/02; H01L 21/3065; H01L 43/12
See application file for complete search history.

(56) References Cited

U.S. PATENT DOCUMENTS

| | | |
|---|---|---|
| 4,597,487 A | 7/1986 | Crosby et al. |
| 5,541,868 A | 7/1996 | Prinz |
| 5,559,952 A | 9/1996 | Fujimoto |
| 5,629,549 A | 5/1997 | Johnson |
| 5,640,343 A | 6/1997 | Gallagher et al. |
| 5,640,566 A | 8/1997 | Johnson |
| 5,654,566 A | 8/1997 | Johnson |
| 5,691,936 A | 11/1997 | Sakakima et al. |
| 5,695,846 A | 12/1997 | Lange et al. |
| 5,695,864 A | 12/1997 | Slonczewski |
| 5,732,016 A | 3/1998 | Chen et al. |
| 5,751,647 A | 5/1998 | O'Toole |
| 5,856,897 A | 1/1999 | Mauri |
| 5,896,252 A | 4/1999 | Kanai |
| 5,966,323 A | 10/1999 | Chen et al. |
| 6,016,269 A | 1/2000 | Peterson et al. |
| 6,055,179 A | 4/2000 | Koganei et al. |
| 6,064,948 A | 5/2000 | West |
| 6,075,941 A | 6/2000 | Itoh |
| 6,097,579 A | 8/2000 | Gill |
| 6,112,295 A | 8/2000 | Bhamidipati et al. |
| 6,124,711 A | 9/2000 | Tanaka et al. |
| 6,134,138 A | 10/2000 | Lu et al. |
| 6,140,838 A | 10/2000 | Johnson |
| 6,154,139 A | 11/2000 | Kanai et al. |

(Continued)

*Primary Examiner* — Errol V Fernandes

(57) ABSTRACT

A method for a photolithographic fabricating process to define pillars having small pitch and pillar size. The method includes coating a hard mask layer of a wafer with a photoresist. The wafer is exposed with a first line pattern comprising a plurality of parallel lines in a first direction. The wafer is then exposed with a second line pattern comprising a plurality of parallel lines in a second direction orthogonal to the first direction. The wafer is then developed to remove areas of the photoresist that were exposed by the first line pattern and the second line pattern resulting in a plurality of pillars.

20 Claims, 6 Drawing Sheets

(56) References Cited

U.S. PATENT DOCUMENTS

| | | |
|---|---|---|
| 6,154,349 A | 11/2000 | Kanai et al. |
| 6,172,902 B1 | 1/2001 | Wegrowe et al. |
| 6,233,172 B1 | 5/2001 | Chen et al. |
| 6,233,690 B1 | 5/2001 | Choi et al. |
| 6,243,288 B1 | 6/2001 | Ishikawa et al. |
| 6,252,798 B1 | 6/2001 | Satoh et al. |
| 6,256,223 B1 | 7/2001 | Sun |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,442,681 B1 | 8/2002 | Ryan et al. |
| 6,447,935 B1 | 9/2002 | Zhang et al. |
| 6,458,603 B1 | 10/2002 | Kersch et al. |
| 6,493,197 B2 | 12/2002 | Ito et al. |
| 6,522,137 B1 | 2/2003 | Sun et al. |
| 6,532,164 B2 | 3/2003 | Redon et al. |
| 6,538,918 B2 | 3/2003 | Swanson et al. |
| 6,545,906 B1 | 4/2003 | Savtchenko et al. |
| 6,563,681 B1 | 5/2003 | Sasaki et al. |
| 6,566,246 B1 | 5/2003 | deFelipe et al. |
| 6,603,677 B2 | 8/2003 | Redon et al. |
| 6,653,153 B2 | 11/2003 | Doan et al. |
| 6,654,278 B1 | 11/2003 | Engel et al. |
| 6,677,165 B1 | 1/2004 | Lu et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,744,086 B2 | 6/2004 | Daughton et al. |
| 6,750,491 B2 | 6/2004 | Sharma et al. |
| 6,765,824 B2 | 7/2004 | Kishi et al. |
| 6,772,036 B2 | 8/2004 | Eryurek et al. |
| 6,773,515 B2 | 8/2004 | Li et al. |
| 6,777,730 B2 | 8/2004 | Daughton et al. |
| 6,812,437 B2 | 11/2004 | Levy et al. |
| 6,829,161 B2 | 12/2004 | Huai et al. |
| 6,835,423 B2 | 12/2004 | Chen et al. |
| 6,838,740 B2 | 1/2005 | Huai et al. |
| 6,842,317 B2 | 1/2005 | Sugita et al. |
| 6,847,547 B2 | 1/2005 | Albert et al. |
| 6,887,719 B2 | 5/2005 | Lu et al. |
| 6,888,742 B1 | 5/2005 | Nguyen et al. |
| 6,902,807 B1 | 6/2005 | Argoitia et al. |
| 6,906,369 B2 | 6/2005 | Ross et al. |
| 6,920,063 B2 | 7/2005 | Huai et al. |
| 6,933,155 B2 | 8/2005 | Albert et al. |
| 6,958,927 B1 | 10/2005 | Nguyen et al. |
| 6,967,863 B2 | 11/2005 | Huai |
| 6,980,469 B2 | 12/2005 | Kent et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,839 B2 | 2/2006 | Kawabata et al. |
| 7,005,958 B2 | 2/2006 | Wan |
| 7,006,375 B2 | 2/2006 | Covington |
| 7,009,877 B1 | 3/2006 | Huai et al. |
| 7,041,598 B2 | 5/2006 | Sharma |
| 7,045,368 B2 | 5/2006 | Hong et al. |
| 7,170,778 B2 | 1/2007 | Kent et al. |
| 7,190,611 B2 | 3/2007 | Nguyen et al. |
| 7,203,129 B2 | 4/2007 | Lin et al. |
| 7,227,773 B1 | 6/2007 | Nguyen et al. |
| 7,262,941 B2 | 8/2007 | Li et al. |
| 7,307,876 B2 | 12/2007 | Kent et al. |
| 7,335,960 B2 | 2/2008 | Han et al. |
| 7,351,594 B2 | 4/2008 | Bae et al. |
| 7,352,021 B2 | 4/2008 | Bae et al. |
| 7,376,006 B2 | 5/2008 | Bednorz et al. |
| 7,449,345 B2 | 11/2008 | Horng et al. |
| 7,476,919 B2 | 1/2009 | Hong et al. |
| 7,573,737 B2 | 8/2009 | Kent et al. |
| 7,619,431 B2 | 11/2009 | DeWilde et al. |
| 7,911,832 B2 | 3/2011 | Kent et al. |
| 7,936,595 B2 | 5/2011 | Han et al. |
| 7,986,544 B2 | 7/2011 | Kent et al. |
| 8,279,666 B2 | 10/2012 | Dieny et al. |
| 8,334,213 B2 | 12/2012 | Mao |
| 8,363,465 B2 | 1/2013 | Kent et al. |
| 8,492,881 B2 | 7/2013 | Kuroiwa et al. |
| 8,535,952 B2 | 9/2013 | Ranjan et al. |
| 8,574,928 B2 | 11/2013 | Satoh et al. |
| 8,617,408 B2 | 12/2013 | Balamane |
| 8,716,817 B2 | 5/2014 | Saida |
| 8,737,137 B1 | 5/2014 | Choy et al. |
| 9,082,888 B2 | 7/2015 | Kent et al. |
| 9,263,667 B1 | 2/2016 | Pinarbasi |
| 9,406,876 B2 | 8/2016 | Pinarbasi |
| 2002/0090533 A1 | 7/2002 | Zhang et al. |
| 2002/0105823 A1 | 8/2002 | Redon et al. |
| 2003/0117840 A1 | 6/2003 | Sharma et al. |
| 2003/0151944 A1 | 8/2003 | Saito |
| 2003/0197984 A1 | 10/2003 | Inomata et al. |
| 2003/0218903 A1 | 11/2003 | Luo |
| 2004/0012994 A1 | 1/2004 | Slaughter et al. |
| 2004/0061154 A1 | 4/2004 | Huai et al. |
| 2004/0094785 A1 | 5/2004 | Zhu et al. |
| 2004/0130936 A1 | 7/2004 | Nguyen et al. |
| 2004/0257717 A1 | 12/2004 | Sharma et al. |
| 2005/0041342 A1 | 2/2005 | Huai et al. |
| 2005/0051820 A1 | 3/2005 | Stojakovic et al. |
| 2005/0063222 A1 | 3/2005 | Huai et al. |
| 2005/0104101 A1 | 5/2005 | Sun et al. |
| 2005/0128842 A1 | 6/2005 | Wei |
| 2005/0136600 A1 | 6/2005 | Huai |
| 2005/0158881 A1 | 7/2005 | Sharma |
| 2005/0180202 A1 | 8/2005 | Huai et al. |
| 2005/0184839 A1 | 8/2005 | Nguyen et al. |
| 2005/0201023 A1 | 9/2005 | Huai et al. |
| 2005/0237787 A1 | 10/2005 | Huai et al. |
| 2005/0280058 A1 | 12/2005 | Pakala et al. |
| 2005/0285176 A1* | 12/2005 | Kim .................. H01L 27/10852 257/304 |
| 2006/0018057 A1 | 1/2006 | Huai |
| 2006/0049472 A1 | 3/2006 | Diao et al. |
| 2006/0087880 A1 | 4/2006 | Mancoff et al. |
| 2006/0092696 A1 | 5/2006 | Bessho |
| 2006/0132990 A1 | 6/2006 | Morise et al. |
| 2006/0227465 A1 | 10/2006 | Inokuchi et al. |
| 2007/0019337 A1 | 1/2007 | Apalkov et al. |
| 2007/0242501 A1 | 10/2007 | Hung et al. |
| 2007/0283313 A1* | 12/2007 | Ogawa ...................... G03F 1/30 716/51 |
| 2008/0049488 A1 | 2/2008 | Rizzo |
| 2008/0112094 A1 | 5/2008 | Kent et al. |
| 2008/0151614 A1 | 6/2008 | Guo |
| 2008/0259508 A2 | 10/2008 | Kent et al. |
| 2008/0297292 A1 | 12/2008 | Viala et al. |
| 2009/0046501 A1 | 2/2009 | Ranjan et al. |
| 2009/0072185 A1 | 3/2009 | Raksha et al. |
| 2009/0091037 A1 | 4/2009 | Assefa et al. |
| 2009/0098413 A1 | 4/2009 | Kanegae |
| 2009/0161421 A1 | 6/2009 | Cho et al. |
| 2009/0209102 A1 | 8/2009 | Zhong et al. |
| 2009/0231909 A1 | 9/2009 | Dieny et al. |
| 2010/0124091 A1 | 5/2010 | Cowburn |
| 2010/0193891 A1 | 8/2010 | Wang et al. |
| 2010/0246254 A1 | 9/2010 | Prejbeanu et al. |
| 2010/0271870 A1 | 10/2010 | Zheng et al. |
| 2010/0290275 A1 | 11/2010 | Park et al. |
| 2011/0032645 A1 | 2/2011 | Noel et al. |
| 2011/0058412 A1 | 3/2011 | Zheng et al. |
| 2011/0089511 A1 | 4/2011 | Keshtbod et al. |
| 2011/0133298 A1 | 6/2011 | Chen et al. |
| 2012/0052258 A1 | 3/2012 | Op DeBeeck et al. |
| 2012/0069649 A1 | 3/2012 | Ranjan et al. |
| 2012/0280336 A1 | 6/2012 | Watts |
| 2012/0181642 A1 | 7/2012 | Prejbeanu et al. |
| 2012/0188818 A1 | 7/2012 | Ranjan et al. |
| 2012/0280339 A1 | 11/2012 | Zhang et al. |
| 2012/0294078 A1 | 11/2012 | Kent et al. |
| 2012/0299133 A1 | 11/2012 | Son et al. |
| 2013/0001506 A1 | 1/2013 | Sato et al. |
| 2013/0001652 A1 | 1/2013 | Yoshikawa et al. |

(56) References Cited

U.S. PATENT DOCUMENTS

| | | |
|---|---|---|
| 2013/0021841 A1 | 1/2013 | Zhou et al. |
| 2013/0244344 A1 | 9/2013 | Malmhall et al. |
| 2013/0267042 A1 | 10/2013 | Satoh et al. |
| 2013/0270661 A1 | 10/2013 | Yi et al. |
| 2013/0307097 A1 | 11/2013 | Yi et al. |
| 2013/0341801 A1 | 12/2013 | Satoh et al. |
| 2014/0009994 A1 | 1/2014 | Parkin et al. |
| 2014/0042571 A1 | 2/2014 | Gan et al. |
| 2014/0070341 A1 | 3/2014 | Beach et al. |
| 2014/0103472 A1 | 4/2014 | Kent et al. |
| 2014/0169085 A1 | 6/2014 | Wang et al. |
| 2014/0177316 A1 | 6/2014 | Otsuka et al. |
| 2014/0217531 A1 | 8/2014 | Jan |
| 2014/0252439 A1 | 9/2014 | Guo |
| 2014/0264671 A1 | 9/2014 | Chepulskyy et al. |
| 2015/0056368 A1 | 2/2015 | Wang et al. |
| 2016/0087193 A1 | 3/2016 | Pinarbasi et al. |
| 2016/0124299 A1* | 5/2016 | Yu .................. G03F 1/30 430/5 |
| 2016/0163973 A1 | 6/2016 | Pinarbasi |

* cited by examiner

500

501
Coating a hard mask layer of a wafer with a photoresist

502
Exposing the wafer with a first line pattern comprising a plurality of parallel lines in a first direction

503
Exposing the wafer with a second line pattern comprising a plurality of parallel lines in a second direction orthogonal to the first direction

504
Developing the wafer to remove areas of the photoresist that were exposed by the first line pattern and the second line pattern resulting in a plurality of pillars

FIG. 5

PROCESS FOR CREATING DENSE PILLARS USING MULTIPLE EXPOSURES FOR MRAM FABRICATION

FIELD OF THE INVENTION

Embodiments of the present invention are generally related to the fabrication of integrated circuit structures used in memory systems that can be used by computer systems, including embedded computer systems.

BACKGROUND OF THE INVENTION

Magnetoresistive random-access memory ("MRAM") is a non-volatile memory technology that stores data through magnetic storage elements. These elements are two ferromagnetic plates or electrodes that can hold a magnetic field and are separated by a non-magnetic material, such as a non-magnetic metal or insulator. This structure is known as a magnetic tunnel junction (MTJ).

MRAM devices can store information by changing the orientation of the magnetization of the free layer of the MTJ. In particular, based on whether the free layer is in a parallel or anti-parallel alignment relative to the reference layer, either a one or a zero can be stored in each MRAM cell. Due to the spin-polarized electron tunneling effect, the electrical resistance of the cell change due to the orientation of the magnetic fields of the two layers. The electrical resistance is typically referred to as tunnel magnetoresistance (TMR) which is a magnetoresistive effect that occurs in a MTJ. The cell's resistance will be different for the parallel and antiparallel states and thus the cell's resistance can be used to distinguish between a one and a zero. One important feature of MRAM devices is that they are non-volatile memory devices, since they maintain the information even when the power is off.

MRAM devices are considered as the next generation structures for a wide range of memory applications. MRAM products based on spin torque transfer switching are already making its way into large data storage devices. Spin transfer torque magnetic random access memory (STT-MRAM), or spin transfer switching, uses spin-aligned (polarized) electrons to change the magnetization orientation of the free layer in the magnetic tunnel junction. In general, electrons possess a spin, a quantized number of angular momentum intrinsic to the electron. An electrical current is generally unpolarized, e.g., it consists of 50% spin up and 50% spin down electrons. Passing a current though a magnetic layer polarizes electrons with the spin orientation corresponding to the magnetization direction of the magnetic layer (e.g., polarizer), thus produces a spin-polarized current. If a spin-polarized current is passed to the magnetic region of a free layer in the MTJ device, the electrons will transfer a portion of their spin-angular momentum to the magnetization layer to produce a torque on the magnetization of the free layer. Thus, this spin transfer torque can switch the magnetization of the free layer, which, in effect, writes either a one or a zero based on whether the free layer is in the parallel or anti-parallel states relative to the reference layer.

The fabrication of MRAM involves the formation of small MTJ (Magnetic Tunnel Junction) patterns in pillar shapes. The pillars or pillar structures can be patterned on a hard mask layer and then transferred to MTJ films. The patterning of pillars on a hard mask layer is traditionally done using an electron beam in a research environment. However, for high volume production, electron beam patterning is not cost effective as the process is very slow. Alternately, these pillars can be patterned using optical lithography tools. Optical lithography resolution is limited by diffraction. Since the pillars, when printed onto a layer of photoresist, are two dimensional features, it is more challenging to achieve the same resolution as the resolution can be achieved by a 1D pattern such as a line.

There exists a problem in that pillar patterning is not a very common patterning technique for optical lithography. There is difficulty in obtaining the desired density of an array of pillars using the conventional optical lithography techniques. It is advantageous to fabricate pillars with small sizes for increased density to improve memory capacity and performance. The only way to scale production by an order of magnitude or more is through the use of optical lithography as opposed to electron beam lithography.

Thus what is needed is a method to improve pillar definition using optical lithography (e.g., photolithography) techniques. What is also needed is a pillar definition photolithographic technique which readily integrates into the resist application process in an MRAM photolithography process. What is needed is a fabrication process for pillar structures that results in small pillar dimensions but can be applied for volume production.

SUMMARY OF THE INVENTION

Embodiments of the present invention implement a method to improve pillar definition using photolithographic techniques. Embodiments of the present invention implement a pillar definition photolithographic technique which readily integrates into the resist application process in an MRAM photolithography process. Line spaces with much smaller pitch width and line sizes are common photolithography features which can be used to create patterns. Embodiments of the present invention utilize these techniques to create dense pillar patterns.

In one embodiment the present invention is implemented as a method for a photolithographic fabricating process to define pillars having small pitch width and pillar size. The method includes coating a hard mask layer of a wafer with a photoresist. The wafer is exposed firstly with a first line pattern comprising a plurality of parallel lines in a first direction. The wafer is then exposed secondly with a second line pattern comprising a plurality of parallel lines in a second direction orthogonal to the first direction. The wafer is then developed to remove areas of the photoresist that were exposed by the first line pattern and the second line pattern resulting in a plurality of pillars. In so doing, the multiple exposures of the present invention fabricates pillar dimensions that are smaller than what the photolithography process could otherwise produce.

In one embodiment, the method further comprises exposing the wafer with a third line pattern comprising a plurality of parallel lines to reduce a pitch width of the plurality of pillars.

In one embodiment, the method further comprises using a reactive ion etch (ME) process to transfer the plurality of pillars pattern to the hard mask layer resulting in a patterned hard mask layer.

In one embodiment, the transferring dimensions of the patterned hard mask layer to a film stack below the patterned hard mask layer is implemented using an MRAM fabrication process.

In one embodiment, the hard mask layer is fabricated to be compatible with an electron beam process. In one embodiment, the wafer is developed with a positive developer.

In one embodiment, the first line pattern is of a different pitch than the second line pattern. In one embodiment, first line pattern is of a different size than the second line pattern.

In one embodiment the present invention is implemented as a method for reducing pillar pitch width of a wafer fabrication process. The method includes coating a hard mask layer of a wafer with a photoresist. The wafer is exposed with a first line pattern comprising a plurality of parallel lines in a first direction. The wafer is then exposed with a second line pattern comprising a plurality of parallel lines in a second direction orthogonal to the first direction. The wafer is then developed to remove areas of the photoresist that were exposed by the first line pattern and the second line pattern resulting in a plurality of pillars.

In one embodiment the present invention is implemented as a method for manufacturing an MRAM device. The method includes coating a hard mask layer of a wafer with a photoresist. The wafer is exposed with a first line pattern comprising a plurality of parallel lines in a first direction. The wafer is then exposed with a second line pattern comprising a plurality of parallel lines in a second direction orthogonal to the first direction. The wafer is then developed to remove areas of the photoresist that were exposed by the first line pattern and the second line pattern resulting in a plurality of pillars.

In this manner, embodiments of the present invention advantageously uses multiple exposures to print a plurality of overlapping lines on a photoresist and then uses photolithographic techniques (e.g., developing) to remove exposed photoresist to create an array of pillars. The multiple exposures enable a much smaller pitch width between the pillars. The smaller pitch width improves the density of the resulting MRAM device. In so doing, the multiple exposures of the present invention fabricates pillar dimensions that are smaller than what the photolithography process could otherwise produce.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention is illustrated by way of example, and not by way of limitation, in the figures of the accompanying drawings and in which like reference numerals refer to similar elements.

FIG. 5 shows a flowchart of the steps of a photolithographic fabricating process to define pillars having small pitch width and pillar size in accordance with one embodiment of the present invention.

DETAILED DESCRIPTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

A Process for Creating Dense Pillars Using Multiple Exposures for MRAM Fabrication Embodiments of the present invention implement a method to improve pillar definition using photolithographic techniques. Embodiments of the present invention implement a pillar definition photolithographic technique which readily integrates into the resist application process in an MRAM photolithography process. Line spaces with much smaller pitch width and line sizes are common photolithography features which can be used to create patterns. Embodiments of the present invention utilize techniques pattern pillars.

In one embodiment the present invention is implemented as a method for a photolithographic fabricating process to define pillars having small pitch width and pillar size. The method includes coating a hard mask layer of a wafer with a photoresist. The wafer is exposed with a first line pattern comprising a plurality of parallel lines in a first direction. The wafer is then exposed with a second line pattern comprising a plurality of parallel lines in a second direction orthogonal to the first direction. The wafer is then developed to remove areas of the photoresist that were exposed by the first line pattern and the second line pattern resulting in a plurality of pillars.

Figure 1:
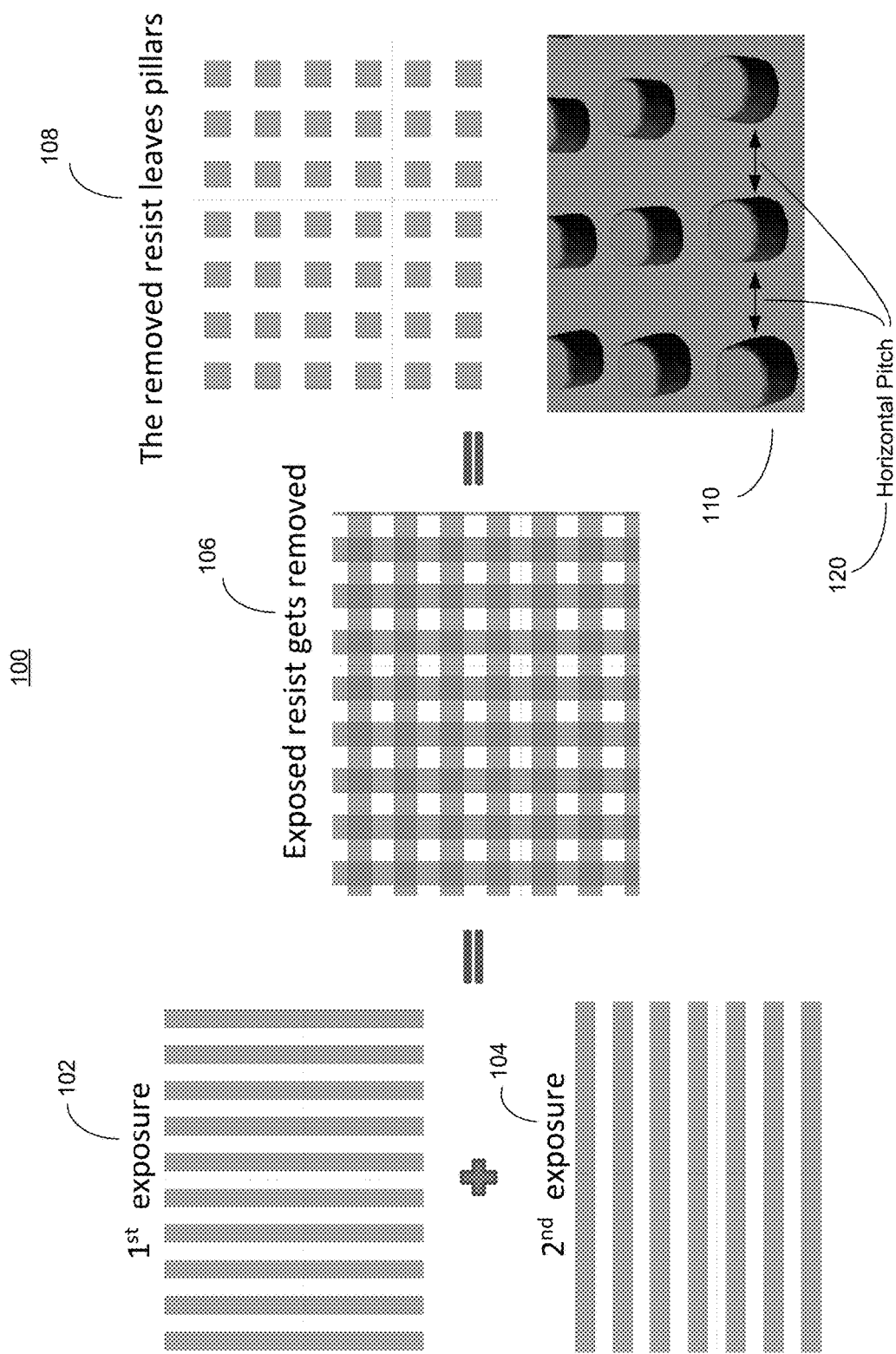
FIG. 1 shows the steps of a process for fabricating an array of pillars in accordance with one embodiment of the present invention having duel orthogonal exposures.

FIG. 1 shows the steps of a process 100 for fabricating an array of pillars in accordance with one embodiment of the present invention. Process 100 shows a case where multiple exposures are used. In this case, two exposures are depicted. Process 100 begins in step 102, where a first exposure is produced (e.g., by exposing the photoresist using a mask and a scanner). This exposure is on the resist that coats the hard mask layer of the wafer, and comprises a plurality of parallel lines as shown. In step 104, a second exposure is produced that is comprised of lines that are orthogonal to the lines of the exposure 102. This exposure is also on the resist that coats the hard mask layer of the wafer, and in this case, comprises a plurality of parallel lines that are orthogonal to the parallel lines of the first exposure. The lines of the first exposure and the orthogonal lines of the second exposure overlap each other on the photoresist.

Step 106 shows the overlapping lines of the first exposure and the second exposure. In step 106, the wafer is developed such that the exposed areas of the photoresist are removed. This leads to the wafer as illustrated in step 108, where the removed photoresist leaves behind the array of pillars. As shown in step 108, the pillars from the top-down view initially appear as small squares, but upon developing where the exposed photoresist is removed, the pillars assume a circular solid cylindrical shape. As shown in step 110, these pillars have a very small horizontal pitch 120, in comparison to any array of pillars producible with photolithographic tools and methods of the prior art.

It should be noted that, in the present embodiment, when the hard mask layer is developed prior to the application of the photoresist, the development includes making the hard mask layer compatible with electron beam lithography processes that are capable of running on multiple photolithographic tool sets. This enhances the portability of the embodiments of the present invention.

It should be noted that, in one embodiment, the wafer is exposed with the first mask. Then without taking the wafer out of the scanning tool, the exposure is continued with the second and further exposure patterns. Multiple options can be utilized in these exposures.

Figure 2:
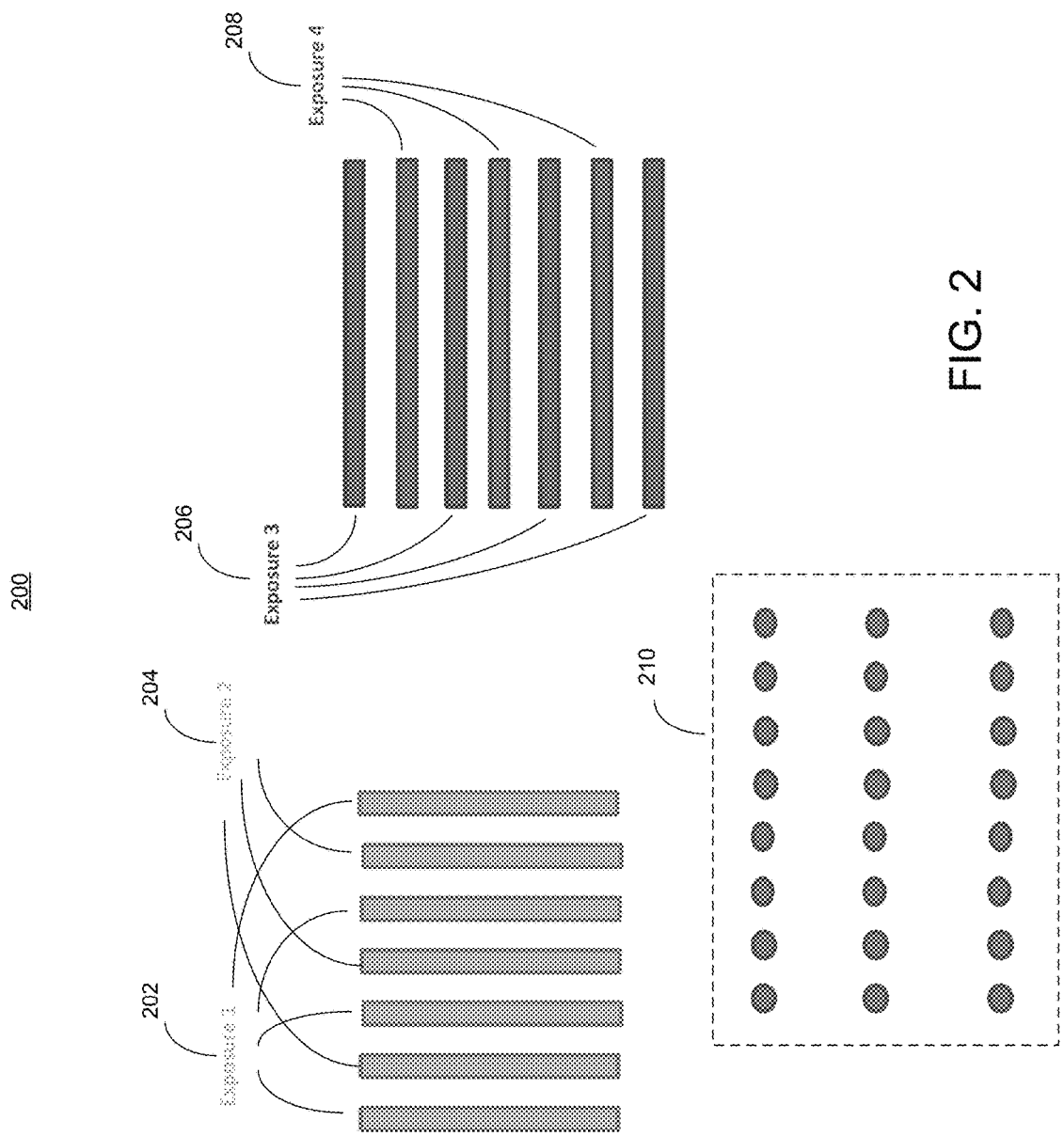
FIG. 2 shows a process where multiple exposures of the same direction or orientation are used in accordance with one embodiment of the present invention.

FIG. 2 shows a process 200 where multiple exposures are used in accordance with one embodiment of the present invention. In the FIG. 2 embodiment, a total of 4 different masks and exposures are used. Each of the four exposures requires a different mask. The left-hand side of FIG. 2 shows the parallel vertical lines of a first exposure 202. The darker lines are the exposed areas. The light areas are unexposed. These are interleaved with the parallel vertical lines of a second exposure 204. In the present embodiment, the interleaved parallel vertical lines of the second exposure are offset from the parallel vertical lines of the first exposure. Interleaving dual exposures enables a smaller horizontal pitch width (e.g., horizontal pitch width 120 of FIG. 1) than achievable with conventional photolithography of the prior art.

Once the wafer is coated with resist, it is exposed on a scanner with exposure 1 202, exposure 2 204, exposure 3 206, and then exposure 4 208. The benefit of this method would be the achievement of a pillar pattern having different pitches in both horizontal and vertical directions, as shown in the resulting pillar array 210, where the pillars have a larger vertical pitch than horizontal pitch. Once all 4 exposures are completed, the wafer is then developed with the exposed photoresist being removed in the development process leaving a pillar pattern 210 on the wafer at the unexposed intersection of each of the lines.

Figure 3:
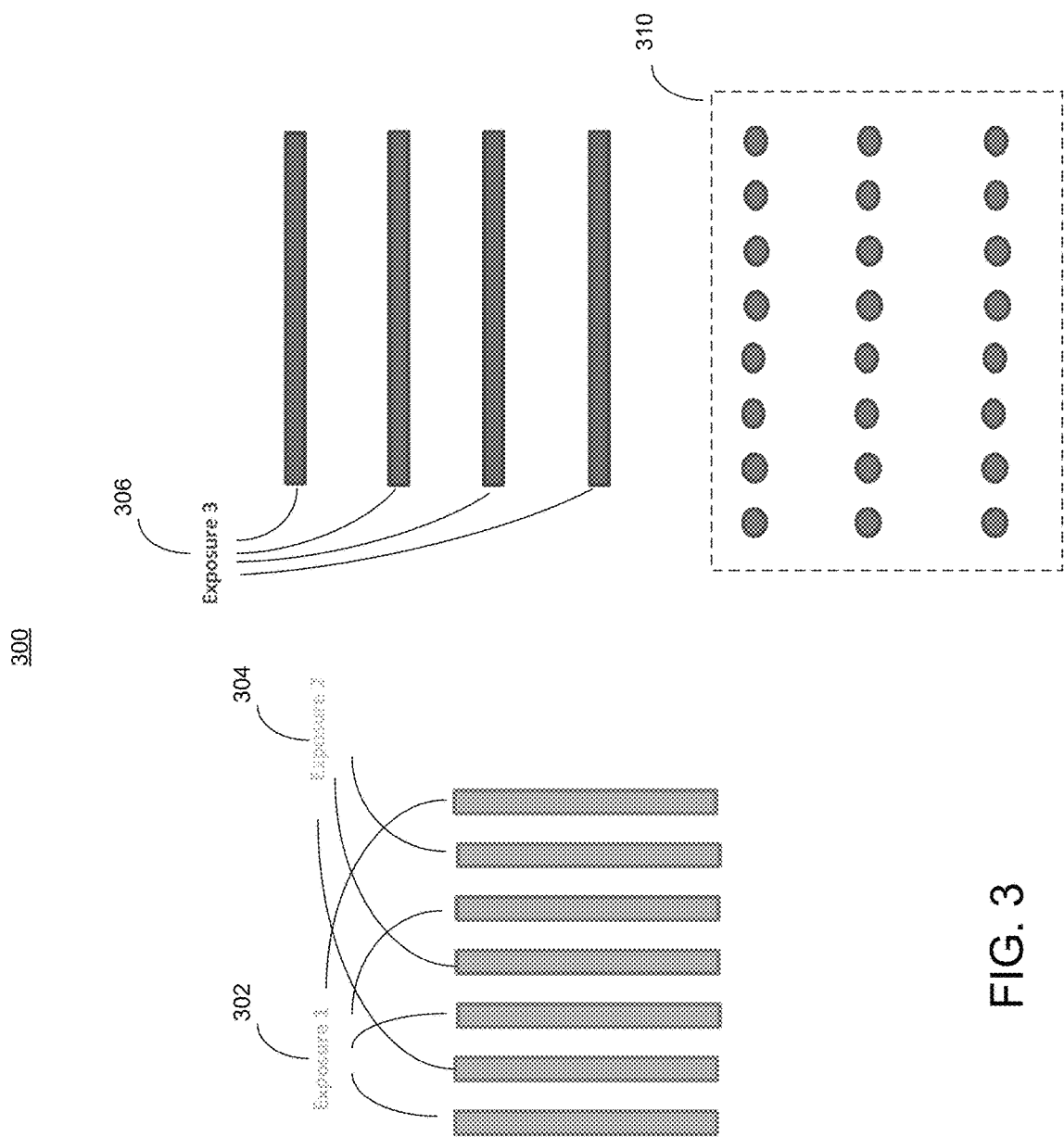
FIG. 3 shows a process where multiple exposures are used in accordance with a second embodiment of the present invention having duel orthogonal and same orientation direction exposures.

FIG. 3 shows a process 300 where multiple exposures are used in accordance with one embodiment of the present invention. In the FIG. 3 embodiment, a total of 3 different masks and exposures are used. Each of the three exposures requires a different mask. The left-hand side of FIG. 3 shows the parallel vertical lines of a first exposure 302. These are interleaved and offset with the parallel vertical lines of a second exposure 304. As described above, embodiments of the present invention can implement interleaving dual exposures to enable a smaller horizontal pitch (e.g., horizontal pitch 120 of FIG. 1) than achievable with conventional photolithography of the prior art.

Figure 4:
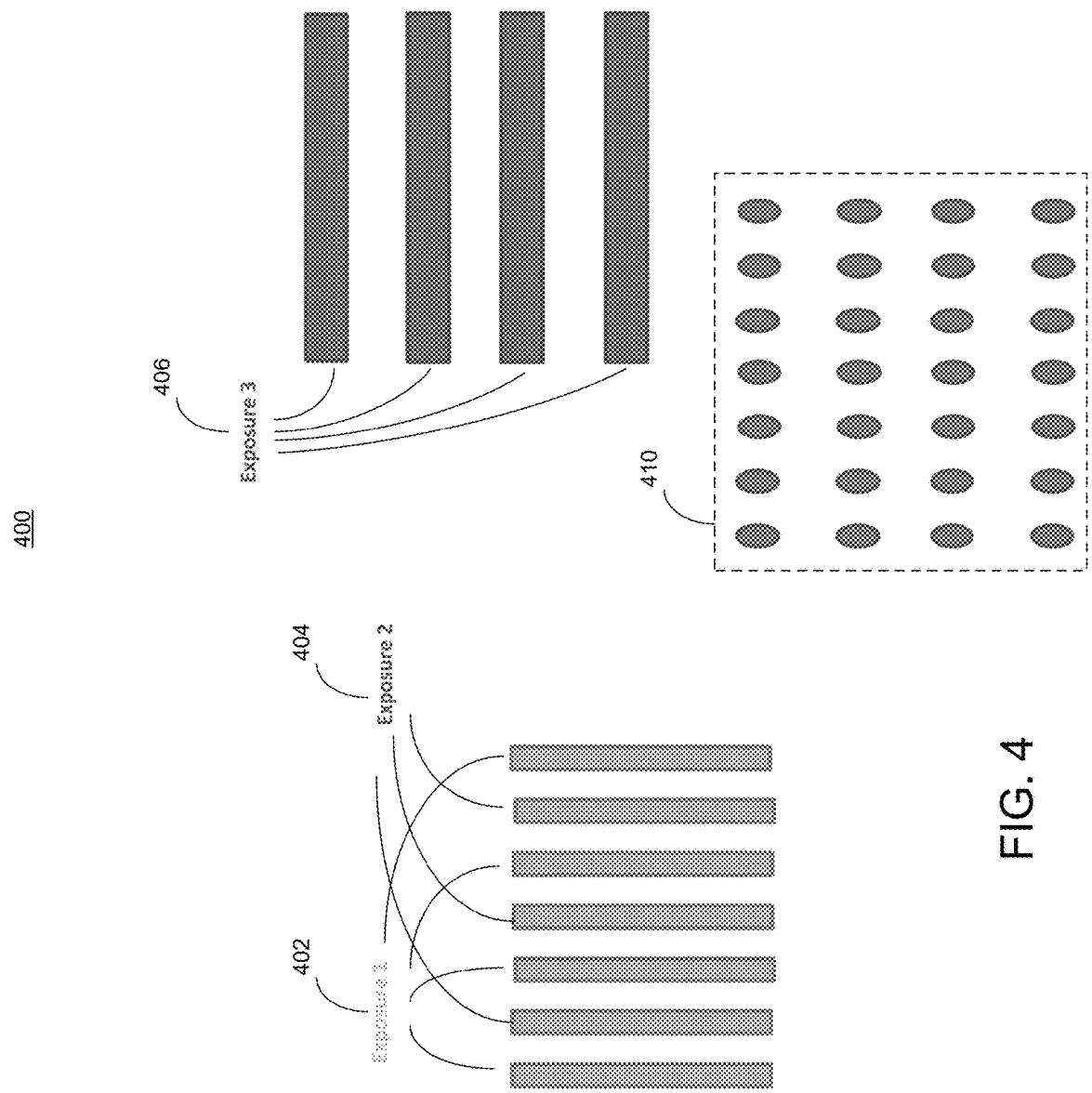
FIG. 4 shows a process where multiple exposures are used in accordance with a third embodiment of the present invention.

The wafer is then given a third exposure 306. It should be noted that the pitch in exposure 3 306 is different than the pitch between adjacent lines in exposure 1 302 and exposure 2 304. The darker lines are the exposed areas. The light areas are unexposed. Once the wafer is developed, the exposed photoresist is removed and a pillar pattern 310 remains on the wafer at the unexposed intersections of each of the lines. As the pitch in exposure 3 306 is different than the pitch in exposure 1 302 and exposure 2 304, the resulting array of pillars pattern 310 has circular pillars with a different pitch in the x and y directions FIG. 4 shows a process 400 where multiple exposures are used in accordance with one embodiment of the present invention. In the FIG. 4 embodiment, a total of 3 different masks and exposures are used. Each of the three exposures requires a different mask. The left-hand side of FIG. 4 shows the parallel vertical lines of a first exposure 402. These are interleaved with the parallel vertical lines of a second exposure 404.

In the FIG. 4 embodiment, exposure 1 402, exposure 2 404, and exposure 3 406 are similar as described above in the embodiment of FIG. 3. However, in the FIG. 4 embodiment, the thickness of the horizontal lines of the exposure 3 406 is greater than the thickness of the vertical lines of the exposure 1 402 and exposure 2 404. As a result, once the wafer is developed, the result would be a pillar array 410 having elongated pillars rather than circular pillars. This is also an example of how different shaped pillars can be achieved by using the embodiments of the present invention.

FIG. 5 shows a flowchart of the steps of a photolithographic fabricating process 500 to define pillars having small pitch and pillar size in accordance with one embodiment of the present invention. Process 500 begins with step 501, by coating a hard mask layer of a wafer with a photoresist. In step 502, the wafer is exposed with a first line pattern comprising a plurality of parallel lines in a first direction. In step 503, the wafer is exposed with a second line pattern comprising a plurality of parallel lines in a second direction orthogonal to the first direction. And in step 504, the wafer is developed to remove areas of the photoresist that were exposed by the first line pattern and the second line pattern resulting in a plurality of pillars.

Figure 6:
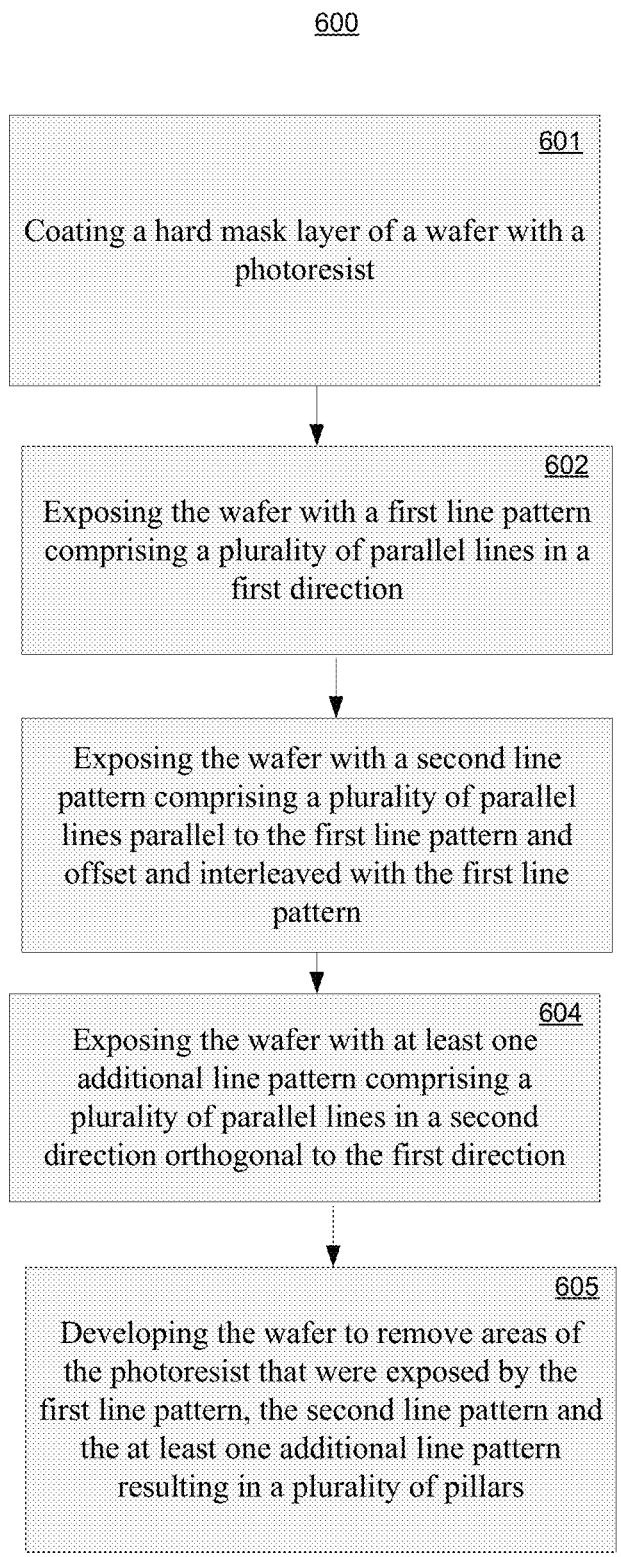
FIG. 6 shows a flowchart of the steps of a second photolithographic fabricating process to define pillars having small pitch and pillar size in accordance with one embodiment of the present invention.

FIG. 6 shows a flowchart of the steps of a photolithographic fabricating process 600 to define pillars having small pitch and pillar size in accordance with one embodiment of the present invention. Process 600 begins with step 601, by coating a hard mask layer of a wafer with a photoresist. In step 602, the wafer is exposed with a first line pattern comprising a plurality of parallel lines in a first direction. In step 503, the wafer is exposed with a second line pattern comprising a plurality of parallel lines parallel to the first line pattern and offset and interleaved with the first line pattern. In step 604, the wafer is exposed with at least one additional line pattern comprising a plurality of parallel lines in a second direction orthogonal to the first direction. And in step 605, the wafer is developed to remove areas of the photoresist that were exposed by the first line pattern, the second line pattern and the at least one additional line pattern resulting in a plurality of pillars.

The foregoing descriptions of specific embodiments of the present invention have been presented for purposes of illustration and description. They are not intended to be exhaustive or to limit the invention to the precise forms disclosed, and many modifications and variations are possible in light of the above teaching.

The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method for a photolithographic fabricating process for producing a pillar array, the method, comprising:
    coating a hard mask layer of a wafer with a photoresist;
    exposing the wafer with a first line pattern comprising a plurality of parallel lines in a first direction;
    exposing the wafer with a second line pattern comprising a plurality of parallel lines in a second direction orthogonal to the first direction; and
    developing the wafer to remove areas of the photoresist that were exposed by the first line pattern and the second line pattern resulting in a plurality of circular solid cylindrical pillars of the pillar array.

2. The method of claim 1 further comprising exposing the wafer with a third line pattern comprising a plurality of parallel lines to reduce a pitch width of the plurality pillars.

3. The method of claim 1 further comprising using a reactive ion etch (RIE) process to transfer the plurality of pillars pattern to the hard mask layer resulting in a patterned hard mask layer.

4. The method of claim 3 further comprising transferring dimensions of the patterned hard mask layer to a film stack below the patterned hard mask layer using an MRAM fabrication process.

5. The method of claim 1, wherein the hard mask layer is fabricated to be compatible with an electron beam process.

6. The method of claim 1, wherein the wafer is developed with a positive developer.

7. The method of claim 1, wherein the first line pattern is of a different pitch than the second line pattern.

8. The method of claim 1, wherein the first line pattern is of a different size than the second line pattern.

9. A method for reducing pillar pitch width of a wafer fabrication process, the method comprising:
    coating a hard mask layer of a wafer with a photoresist;
    exposing the wafer with a first line pattern comprising a plurality of parallel lines in a first direction;
    exposing the wafer with a second line pattern comprising a plurality of parallel lines in a second direction orthogonal to the first direction;
    developing the wafer to remove areas of the photoresist that were exposed by the first line pattern and the second line pattern resulting in a plurality of circular solid cylindrical pillars.

10. The method of claim 9 further comprising exposing the wafer with a third line pattern comprising a plurality of parallel lines to reduce a pitch width of the plurality pillars.

11. The method of claim 9 further comprising using a reactive ion etch (RIE) process to transfer the plurality of pillars pattern to the hard mask layer resulting in a patterned hard mask layer.

12. The method of claim 11 further comprising transferring dimensions of the patterned hard mask layer to a film stack below the patterned hard mask layer using an MRAM fabrication process.

13. The method of claim 9, wherein the hard mask layer is fabricated to be compatible with an electron beam process.

14. The method of claim 9, wherein the wafer is developed with a positive developer.

15. The method of claim 9, wherein the first line pattern is of a different pitch than the second line pattern.

16. The method of claim 9, wherein the first line pattern is of a different size than the second line pattern.

17. A method for manufacturing an MRAM device, the method comprising:
    coating a hard mask layer of a wafer with a photoresist;
    exposing the wafer with a first line pattern comprising a plurality of parallel lines in a first direction;
    exposing the wafer with a second line pattern comprising a plurality of parallel lines parallel to the first line pattern and offset and interleaved with the first line pattern;
    exposing the wafer with at least one additional line pattern comprising a plurality of parallel lines in a second direction orthogonal to the first direction;
    developing the wafer to remove areas of the photoresist that were exposed by the first line pattern, the second line pattern and the at least one additional line pattern resulting in a plurality circular solid cylindrical of pillars.

18. The method of claim 17 further comprising using a reactive ion etch (RIE) process to transfer the plurality of pillars pattern to the hard mask layer resulting in a patterned hard mask layer.

19. The method of claim 18 further comprising transferring dimensions of the patterned hard mask layer to a film stack below the patterned hard mask layer using an MRAM fabrication process.

20. The method of claim 17, wherein the wafer is developed with a positive developer.

\* \* \* \* \*